United States Patent
Lu et al.

(10) Patent No.: US 6,998,277 B2
(45) Date of Patent: Feb. 14, 2006

(54) METHOD OF PLANARIZING SPIN-ON MATERIAL LAYER AND MANUFACTURING PHOTORESIST LAYER

(75) Inventors: Jefferson Lu, Pingtung (TW); Nien-Yu Tsai, Taipei (TW); Shu-Ching Yang, Taipei (TW)

(73) Assignee: ProMOS Technologies, Inc., Hsinchu (TW)

( * ) Notice: Subject to any disclaimer, the term of this patent is extended or adjusted under 35 U.S.C. 154(b) by 0 days.

(21) Appl. No.: 10/711,379

(22) Filed: Sep. 15, 2004

(65) Prior Publication Data

US 2005/0196879 A1 Sep. 8, 2005

(30) Foreign Application Priority Data

Mar. 5, 2004 (TW) .............................. 93105817 A

(51) Int. Cl.
*H01L 21/00* (2006.01)

(52) U.S. Cl. ...................... 438/9; 438/704; 438/715

(58) Field of Classification Search ................. 438/9, 438/424, 427, 636, 637, 700, 737, 738, 704, 438/715

See application file for complete search history.

(56) References Cited

U.S. PATENT DOCUMENTS

| | | | | |
|---|---|---|---|---|
| 5,753,566 A | * | 5/1998 | Hwang ........................ | 438/715 |
| 5,871,811 A | * | 2/1999 | Wang et al. ................. | 427/248 |
| 6,024,828 A | * | 2/2000 | Hwang ........................ | 156/345 |
| 6,482,716 B1 | | 11/2002 | Wohlfahrt et al. ........... | 438/427 |
| 6,630,397 B1 | | 10/2003 | Ding et al. .................. | 438/636 |
| 6,645,867 B2 | * | 11/2003 | Dokumaci et al. ........... | 438/700 |

* cited by examiner

*Primary Examiner*—David Nhu
(74) *Attorney, Agent, or Firm*—Jiang Chyun IP Office

(57) ABSTRACT

A method of planarizing a spin-on material layer is provided. A substrate having a plurality of openings thereon is provided. A spin-on material layer is formed on the substrate such that the openings are completely filled. A plasma etching process is carried out to remove a portion of the spin-on material layer and expose the substrate surface. During the plasma etching process, the substrate is cooled to maintain an etching selectivity between the spin-on material layer on the substrate surface and the spin-on material layer within the openings so that a planar spin-on material layer is ultimately obtained.

29 Claims, 9 Drawing Sheets

METHOD OF PLANARIZING SPIN-ON MATERIAL LAYER AND MANUFACTURING PHOTORESIST LAYER

CROSS-REFERENCE TO RELATED APPLICATION

This application claims the priority benefit of Taiwan application serial no. 93105817, filed Mar. 5, 2004.

BACKGROUND OF THE INVENTION

1. Field of the Invention

The present invention relates to a semiconductor manufacturing process. More particularly, the present invention relates to a method of planarizing a spin-on material layer and manufacturing a photoresist layer.

2. Description of the Related Art

With an increasing level of circuit integration, the size of the circuit devices continues to shrink. Photolithographic processing plays a very important role in the fabrication of semiconductor devices. All metal-oxide-semiconductor (MOS) related structures including various types of thin film patterns and doped regions are defined by performing photolithographic processes. In fact, the degree of device integration in the semiconductor industry ultimately depends on the production of features with a narrower width in a photolithographic process.

Photolithography is a process that includes a few steps. First, a layer of exposure material called photoresist is formed on the surface of a wafer. Thereafter, light from a planar light source is permitted to illuminate the photoresist layer after passing a photomask having a pattern thereon so that the photoresist layer is selectively exposed. Hence, the pattern on the photomask is transferred to the photoresist layer.

The aforementioned step of depositing a photoresist layer over a wafer is one of the most frequently performed processes in the fabrication of semiconductor. FIGS. 1A and 1B are schematic cross-sectional views showing the step height after coating a photoresist layer over a wafer having different density of openings across its surface. As shown in FIG. 1A, the substrate 100 is a silicon substrate or a semiconductor structure including a dielectric layer, a semiconductor material layer or a conductive layer. The substrate 100 has a plurality of openings 102. These openings 102 are spread out across the surface of the substrate 100 with different degrees of concentration to produce a dense opening region 104 and a sparse opening region 106. In general, the dense opening region 104 refers to an area on the substrate 100 having two or more openings 102 close to each other. On the other hand, the sparse opening region 106 refers to an area on the substrate having a single opening or two openings separated from each other by a large distance.

As shown in FIG. 1B, a photoresist layer 108 is formed over the substrate 100 by spin coating. The photoresist layer 108 completely fills the openings 102. Because of the difference in the density of openings between the dense opening region 104 and the sparse opening region 106, the thickness of the photoresist layer 108 above the dense opening region 104 is different from the sparse opening region 106. Hence, a step height 110 is produced between the two regions 104, 106.

The aforementioned difference in step height of the photoresist layer 108 over the substrate 100 often leads to problems such as non-uniform etching or inaccurate focusing. To reduce the step height, a method that involves repeated etching back process and photoresist coating process (for example, in U.S. Pat. No. 6,482,716 and U.S. Pat. No. 6,630,397) is deployed. In other words, the substrate is transferred to an etching station to perform an etching back operation immediately after the step height is produced. Thereafter, the substrate is transferred to a photolithographic station to perform another photoresist coating process. This procedure is repeated several times so that the step height is gradually removed. However, the aforementioned method can at most reduce the step height but cannot eliminate the step height altogether. Furthermore, the repetitive etching in the etching station followed by the coating in the photolithographic station not only wastes processing time, but also increases the production cost considerably.

In addition, the formation of a step height is not limited to the process of coating a photoresist layer. Similar phenomenon may also occur in spin-coating other materials, such as the bottom anti-reflection coating and the spin-coated glass over a substrate. In other words, a method capable of resolving the step height problem will also resolve a host of similar problems.

SUMMARY OF THE INVENTION

Accordingly, at least one objective of the present invention is to provide a method of planarizing a spin-on material layer such that the step height created in the process of spin-coating a material over a substrate having different density of openings across the substrate surface can be completely eliminated.

At least a second objective of the present invention is to provide a method of fabricating a photoresist layer capable of simplifying the conventional long processing steps necessary for removing the step height so that the processing time is shortened and the production cost is reduced.

At least a third objective of the present invention is to provide a method of fabricating a photoresist layer for producing a deep trench capacitor or a dual damascene structure. The method not only simplifies the processing steps, but also increases the useful areas on a wafer and reduces production cost.

To achieve these and other advantages and in accordance with the purpose of the invention, as embodied and broadly described herein, the invention provides a method of planarizing a spin-on material layer. First, a substrate having at least an opening thereon is provided. A spin-on material layer is formed over the substrate such that the spin-on material completely fills the opening. Thereafter, a plasma etching process is performed to remove a portion of the spin-on material layer so that the surface of the substrate is exposed. During the plasma etching process, the substrate is cooled to maintain an etching selectivity between the spin-on material layer on the substrate surface and the spin-on material layer within the openings. Ultimately, a planar spin-on material layer is obtained.

In the aforementioned method, the spin-on material layer can be a photoresist layer, a bottom anti-reflection coating, a spin-on glass layer or a spin-on dielectric layer. The method of cooling the substrate in the plasma etching process includes passing a liquid coolant over the back surface of the substrate so that the substrate is maintained at a temperature below 50° C. and the etching selectivity between the spin-on material on the substrate surface and the spin-on material within the opening is greater than 3. The opening can be the opening of a dual damascene structure, the trench of a conductive line, a contact opening or the deep trench of a deep trench capacitor.

Furthermore, the substrate can be divided into dense opening regions and sparse opening regions. The spin-on material layer over the dense opening regions has a thickness less than the spin-on material layer over the sparse opening regions. The plasma etching process utilizes a change of signals in material properties on the surface of the substrate or the spin-on material layer to determine the end of the etching process. The signals include a first signal and a second signal. The first signal is issued when the spin-on material layer is etched to such an extent that the substrate surface material layer within the dense opening region is exposed. The second signal is issued when the spin-on material layer is etched to such an extent that the substrate surface material layer within the sparse opening region is exposed.

In the present invention, a liquid coolant is passed over the back surface of the substrate to maintain a constant temperature throughout the wafer so that the etching rate of the spin-on material layer within the opening is reduced. In other words, the spin-on material layer over the substrate surface has an etching rate larger than the spin-on material layer within the opening. Thus, the spin-on material layer is planarized.

After performing the plasma etching process, an etching back process may be carried out to remove a portion of the spin-on material layer within the opening so that the upper surface of the spin-on material layer is at a distance below the upper surface of the substrate. The process of removing a portion of the spin-on material layer within the opening produces a deep trench in the substrate for forming a deep trench capacitor or a via opening for forming a dual damascene structure. Furthermore, the plasma etching process and the etching back process can be carried out within the same plasma etching station. Thus, the fabrication process is simplified and the production time is shortened so that overall production cost is reduced.

When the process of planarizing a spin-on material layer is applied to fabricate the deep trench of a deep trench capacitor and the via opening of a dual damascene structure, the number of virtual openings can be reduced or entirely eliminated. Therefore, useful area on the wafer is increased.

The present invention also provides a method of fabricating a photoresist layer. First, a substrate having a dielectric layer thereon is provided. A plurality of openings is formed in the dielectric layer such that the substrate can be divided into at least two regions, each of which has a different opening density. Thereafter, a spin-on material layer is formed over the substrate such that all the openings are completely filled. A plasma etching process is carried out to remove a portion of the spin-on material layer and expose the substrate surface. During the plasma etching process, the substrate is cooled to maintain an etching selectivity between the spin-on material layer on the substrate surface and the spin-on material layer within the openings so that a planar spin-on material layer is ultimately obtained. Finally, a photoresist layer is formed over the substrate.

In the aforementioned method, the spin-on material layer can be a photoresist layer, a bottom anti-reflecting coating, a spin-on glass layer or a spin-on dielectric layer. The method of cooling the substrate in the plasma etching process includes passing a liquid coolant over the back surface of the substrate so that the substrate is maintained at a temperature below 50° C. and the etching selectivity between the spin-on material on the substrate surface and the spin-on material within the opening is greater than 3. Furthermore, the opening can be the via opening or the trench of a dual damascene structure.

Because the step height in the spin-on material layer between the dense opening region and the sparse opening region is eliminated in the process of fabricating the photoresist layer, problems including the inaccurate focusing and the deviation of critical dimension in a subsequent photo-expose operation can be avoided.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1A:
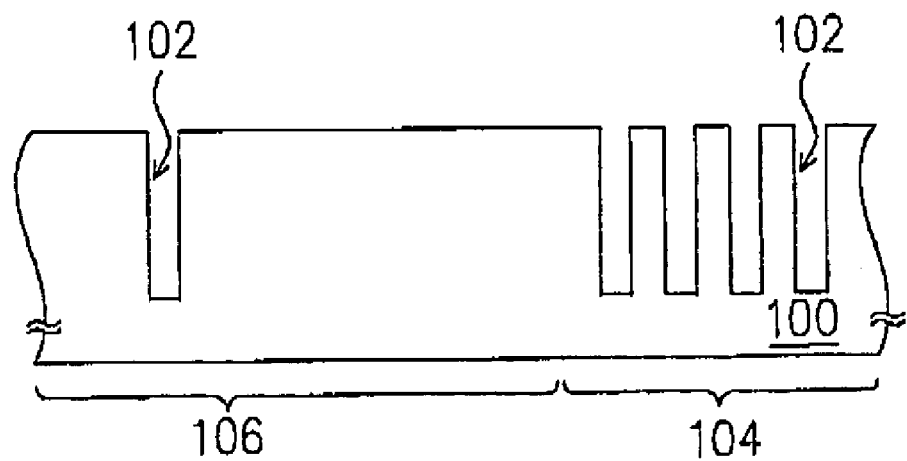
FIGS. 1A and 1B are schematic cross-sectional views showing the step height after coating a photoresist layer over a wafer having different density of openings across its surface.
Figure 1B:
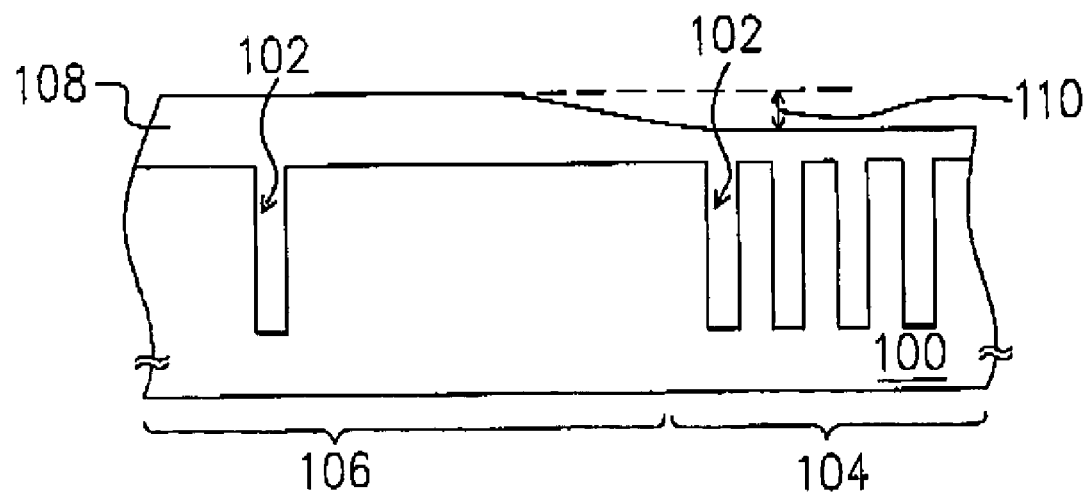

Reference will now be made in detail to the present preferred embodiments of the invention, examples of which are illustrated in the accompanying drawings. Wherever possible, the same reference numbers are used in the drawings and the description to refer to the same or like parts.

The present invention provides a method of planarizing a spin-on material layer. In other words, the step height in the spin-on material layer created by the difference between opening density in different areas of the substrate in a semiconductor production process can be eliminated. Here, the spin-on material includes photoresist material, bottom anti-reflecting coating material, spin-on glass (SOG), spin-on dielectric material or any material suitable for performing a spin-coating process.

Figure 2A:
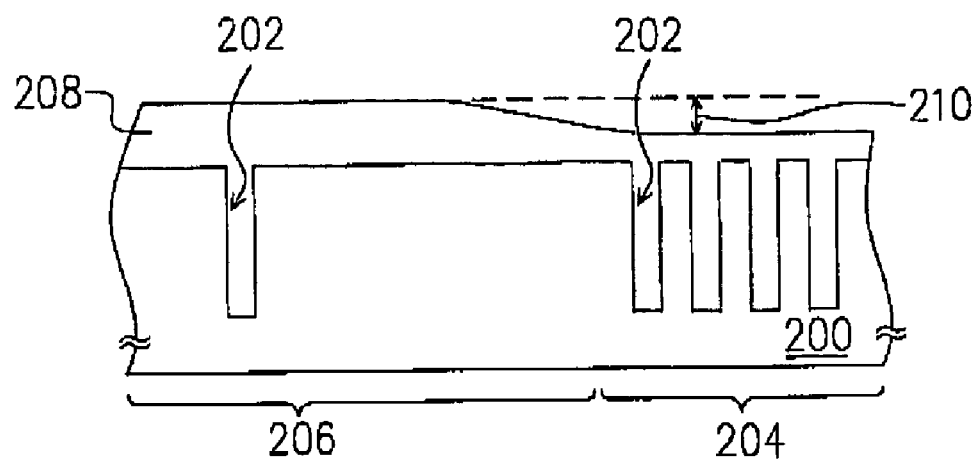
FIGS. 2A and 2B are schematic cross-sectional views showing the steps for planarizing a spin-on material layer according to one preferred embodiment of the present invention.
Figure 2B:
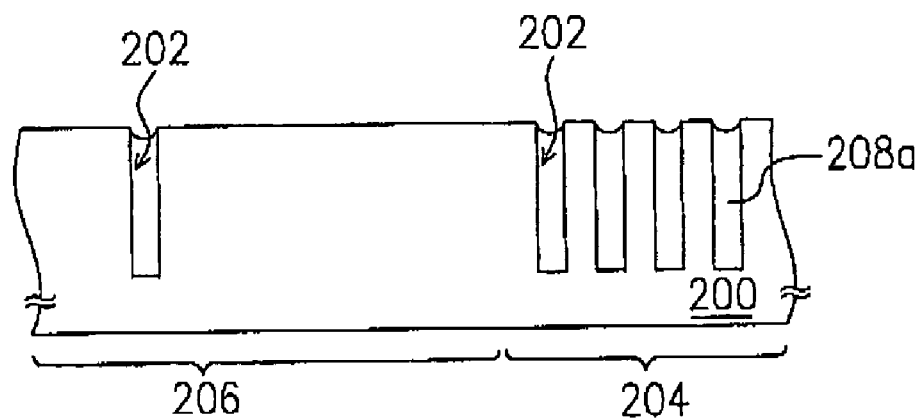

FIGS. 2A and 2B are schematic cross-sectional views showing the steps for planarizing a spin-on material layer according to one preferred embodiment of the present invention. As shown in FIG. 2A, a substrate 200 is provided. The substrate 200 is a silicon substrate or a semiconductor structure covered with a dielectric layer, a semiconductor material layer or a conductive layer, for example. In addition, the substrate 200 has a plurality of openings 202 including the opening of a dual damascene structure, the trench of a conductive line, a via opening, a contact opening or the deep trench of a deep trench capacitor, for example. The substrate 200 is partitioned into dense opening regions 204 and sparse opening regions 206 according to the density of the openings 202. In the dense opening regions 204, two or more openings 202 are positioned closed to each other. On the other hand, the sparse opening regions 206 are areas having a single opening or a multiple of openings separated from each other by a large distance. In other words, the density of openings within the dense opening regions 204 is higher than the density of openings within the sparse opening regions 206 (here, the density of openings is the number of openings per unit area).

Thereafter, a spin-on material layer 208 is formed over the substrate 200 by performing a spin-coating process such that the spin-on material layer 208 completely fills the openings 202. Due to the difference in the density of the openings across the substrate 200, the spin-on material layer 208 has a non-uniform thickness leading to the creation of a step height 210 between the dense opening regions 204 and the sparse opening regions 206.

As shown in FIG. 2B, a plasma-etching process is carried out to remove a portion of the spin-on material layer 208 on the surface of the substrate 200. During the plasma etching process, the substrate 200 is cooled so that the etching rate of the spin-on material layer 208 within the openings 202 is smaller than the etching rate of the spin-on material layer 208 on the surface of the substrate 200. Preferably, the etching selectivity between the spin-on material layer on the substrate surface and the spin-on material layer within the openings 202 is greater than 3. Therefore, after the spin-on material layer 208 over the dense opening regions 204 is completely removed, over-etching of the spin-on material layer 208 within the openings of the dense opening regions 204 is prevented when the spin-on material layer 208 over the sparse opening regions 206 is subsequently carried out. Thus, a planar spin-on material layer 208a is ultimately obtained. In the plasma etching process, the substrate 200 is cooled, for example, by passing a coolant to the back surface of the substrate 200. The coolant is in a gaseous or a liquid state, for example, gaseous helium or chilled water. Preferably, the coolant for cooling the substrate 200 in the plasma etching process is able to bring down the substrate 200 to a temperature below 50° C.

Figure 3:
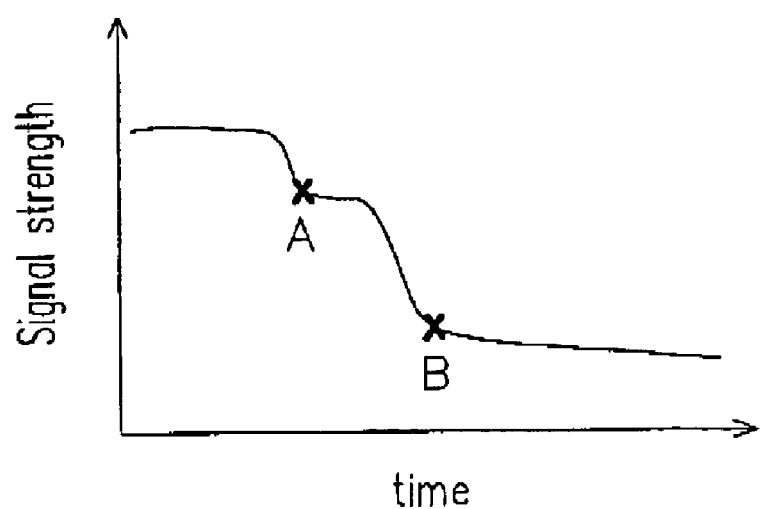
FIG. 3 is a graph showing the relationship between the signal intensity and the plasma etching time of a spin-on material layer.

The plasma etching process utilizes a set of signals obtained through a change of material properties in the spin-on material layer 280 to determine the end of the etching process. When the spin-on material layer 208 is etched to expose the surface material on the substrate 200 inside the dense opening regions 204, a first signal (point A in FIG. 3) is produced. Further on, when the spin-on material layer 208 is etched to expose the surface material on the substrate 200 inside the sparse opening regions 206, a second signal (point B in FIG. 3) is produced. The second signal may serve as a signal for ending the etching process for removing the spin-on material layer 208 on the surface of the substrate 200. Furthermore, the first signal can be utilized to initiate the cooling of the substrate 200 (for example, passing a coolant to the back of the substrate 200). The cooling process brings down the etching rate of the spin-on material layer 208 within the openings 202 relative to the spin-on material layer 208 on the substrate 200. Ultimately, a planarized spin-on material layer 208a is obtained within a shorter plasma-etching period (also refer to the description of FIGS. 4 and 5). Obviously, the plasma etching process may also utilize any change in material properties on the surface of the substrate 200 as a signal for the etching end point.

Figure 4:
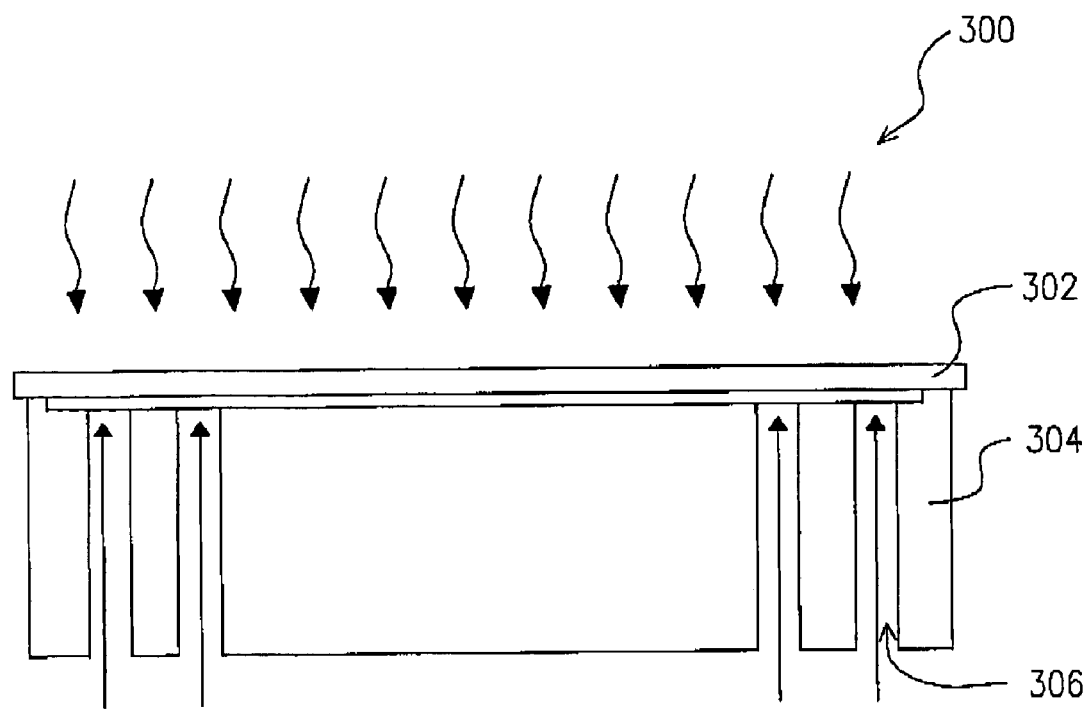
FIG. 4 is a sketch of a plasma reaction chamber for carrying out a plasma etching operation according to the present invention.

FIG. 4 is a sketch of a plasma reaction chamber for carrying out a plasma etching operation according to the present invention. As shown in FIG. 4, the wafer 302 (substrate) is placed on a carrier platform 304 (for example, an electrostatic suction table) inside a plasma-etching chamber 300. A plurality of open channels 306 for the entrance of fluid is set up on the carrier platform 304. These open channels 306 are in contact with the back surface of the wafer 302 indirectly. During the plasma etching process, a fluid is passed into the open channels 306 to control the temperature of the wafer 302 through the back surface of the wafer 302 so that the etching rate within the openings of the wafer 302 is changed. It should be noted that the fluid traveling to the back surface of the wafer does not participate in the chemical reaction inside the plasma-etching chamber. The fluid is used solely for cooling down the temperature of the wafer 302.

Figure 5:
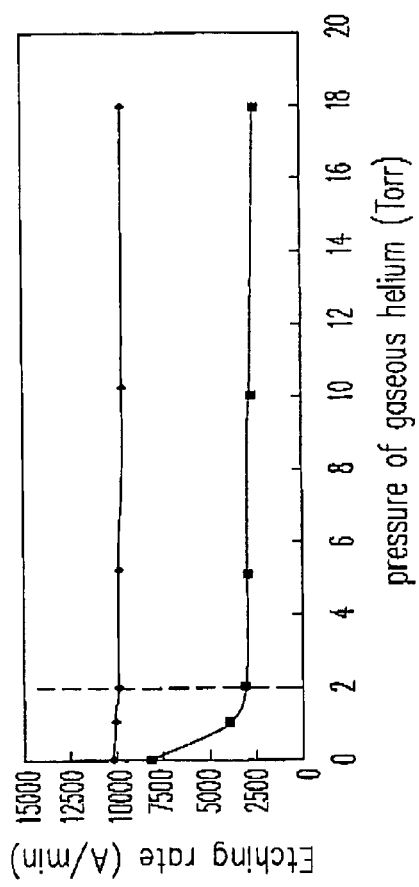
FIG. 5 is a graph showing the relationship between the input pressure of gaseous helium and the etching rate.
Figure 6:
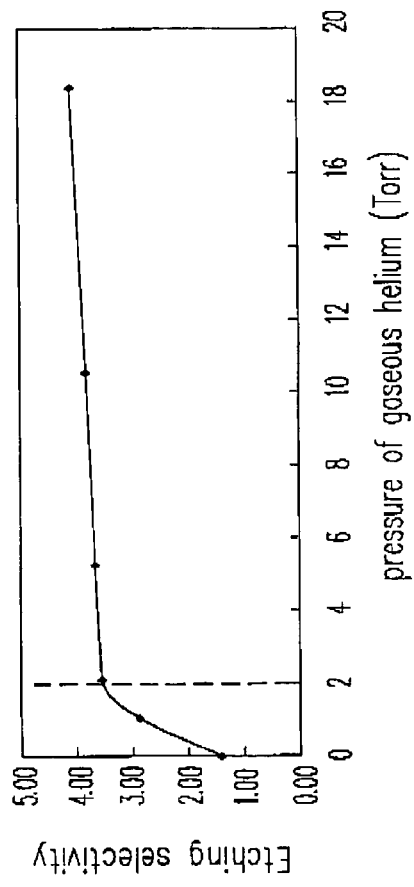
FIG. 6 is a graph showing the relationship between the input pressure of gaseous helium and the etching selectivity (the etching rate ratio between the photoresist material on the substrate surface and inside the opening).

In the following, the process of planarizing a spin-on material layer is explained using an example where the spin-on material layer is a photoresist layer and the fluid used for cooling is gaseous helium (at room temperature). FIG. 5 is a graph showing the relationship between the input pressure of gaseous helium and the etching rate. In FIG. 5, the symbol ♦ represents the etching rate of the photoresist layer on the surface of the substrate and the symbol ■ represents the etching rate of the photoresist layer within the openings of the substrate. FIG. 6 is a graph showing the relationship between the input pressure of gaseous helium and the etching selectivity (the etching rate ratio between the photoresist material on the substrate surface and inside the opening).

As shown in FIG. 5, the difference in etching rate between the photoresist layer inside the openings and the photoresist layer on the surface of the substrate before passing gaseous helium to the back of the wafer is small. As gaseous helium is passed to the back of the wafer, the etching rate of the photoresist layer inside the openings is gradually reduced. When the pressure of the gaseous helium is larger than 2 torrs, the etching rate of the photoresist layer inside the openings is stabilized to a relatively constant value. Similarly, as shown in FIG. 6, as the pressure of the gaseous helium passed to the back surface of the wafer is gradually increased, the etching selectivity between the photoresist layer on the substrate and the photoresist layer within the openings of the substrate is gradually stabilized. In general, the plasma etching process for photoresist material is carried out with a chamber temperature higher than 100° C. Since gaseous helium at room temperature (25° C.) is passed to the back of the wafer in the present invention, the wafer is cooled to a temperature roughly below 50° C. so that the etching rate of photoresist material within the openings is reduced considerably. In other words, the photoresist layer on the surface of the substrate has an etching rate larger than the photoresist layer within the openings of the substrate.

Preferably, the etching selectivity between the spin-on material layer on the substrate and within the substrate is greater than 3 so that a planarized photoresist layer is obtained.

The aforementioned description is only one embodiment of the present invention. Clearly, the operating parameters for controlling the temperature of the substrate in a plasma etching process may be varied according to the forming material of the spin-on material layer.

The aforementioned method has been widely adopted to simplify various fabrication processes. After applying the method of the present invention to planarize the photoresist layer, problems such as inaccurate focusing or deviation of the critical dimension can be avoided. Furthermore, the present invention can also be applied to fabricate a deep trench capacitor and a dual damascene structure.

In the process of fabricating a deep trench capacitor, spin-on material is deposited into a deep trench to define the depth of the lower electrode. However, if the substrate is divided into sparse deep trench regions and dense deep trench regions, the thickness of the spin-on material layer is different over the sparse deep trench regions and the dense deep trench regions of the substrate. Hence, when the spin-on material layer is etched back to define the depth of the lower electrode, the spin-on material will have a non-uniform thickness. Ultimately, the deep trench capacitors will have non-identical properties. Typically, to avoid such a problem, a plurality of dummy trenches is set up around the deep trench. Yet, the setting of dummy trenches reduces the available area on the wafer.

In the process of fabricating a dual damascene structure, a via opening is generally formed before a trench. After forming a via opening, a spin-on material layer is deposited into the via opening and then the spin-on material layer is etched back to form a protective bottom layer in a subsequent trench etching process. However, if the substrate is divided into sparse via regions and dense via regions, the spin-on material layer will have a different thickness over the sparse via regions and the dense via regions of the substrate. Thereafter, when the spin-on material layer is etched back to a predetermined depth, the spin-on material will have a non-uniform depth. Ultimately, the dual damascene structures will have non-identical properties. Typically, to avoid such a problem, a plurality of dummy vias is set up around the via. Yet, the setting of dummy vias reduces the useful area available on the wafer.

Figure 7:
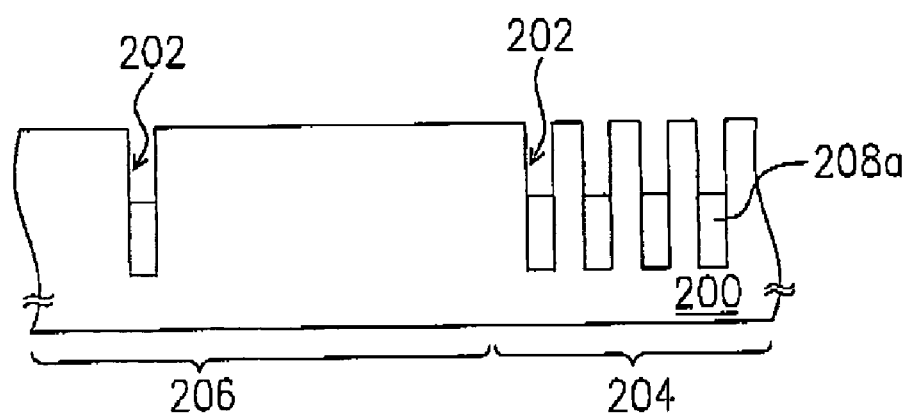
FIG. 7 is a cross-sectional view of a substrate with trenches fabricated according to the present invention for forming deep trench capacitors or dual damascene structures.

FIG. 7 is a cross-sectional view of a substrate with trenches fabricated according to the present invention for forming deep trench capacitors or dual damascene structures. FIG. 7 is a continuation of FIG. 2B where the openings 202 in FIG. 2B are deep trenches for forming deep trench capacitors or via openings for forming dual damascene structures. An etching back process is carried out to remove a portion of the spin-on material layer 208a within the openings 202 so that the top of the spin-on material layer 208a is at a distance away from the top of the substrate 200. Because the step height 210 (as shown in FIG. 2A) between the spin-on material layer 208 in the dense opening regions 204 and the sparse opening regions 206 has already been eliminated, the spin-on material layer 208a within each opening 202 has a substantially identical thickness. Therefore, large variation in the properties between the deep trench capacitors or the dual damascene structures is avoided. In addition, the etching back process can be carried out without controlling the temperature (without passing a fluid to the back of the substrate 200) of the substrate 200. Hence, the etching rate of the spin-on material layer 208 within the openings 202 during the plasma etching process can be increased (as shown in FIG. 5). In this way, the processing time can be shortened and the production cost can be reduced.

Figure 8A:
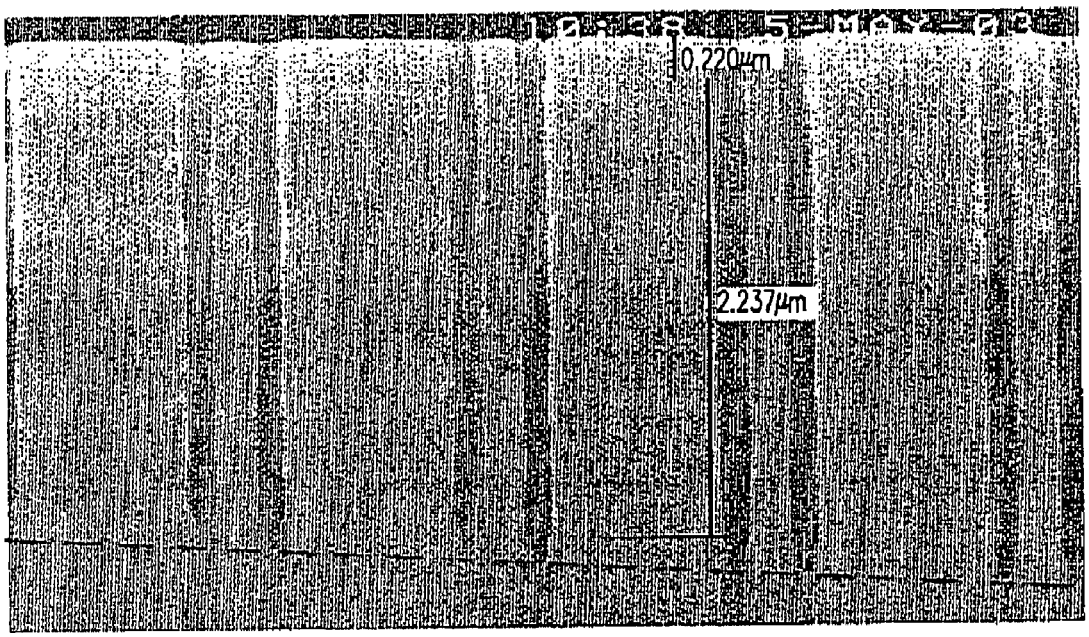
FIGS. 8A and 8B are scanning electron microscope pictures showing a substrate with deep trenches, which a photoresist layer is formed by a conventional method and by the method of the present invention, respectively.
Figure 8B:
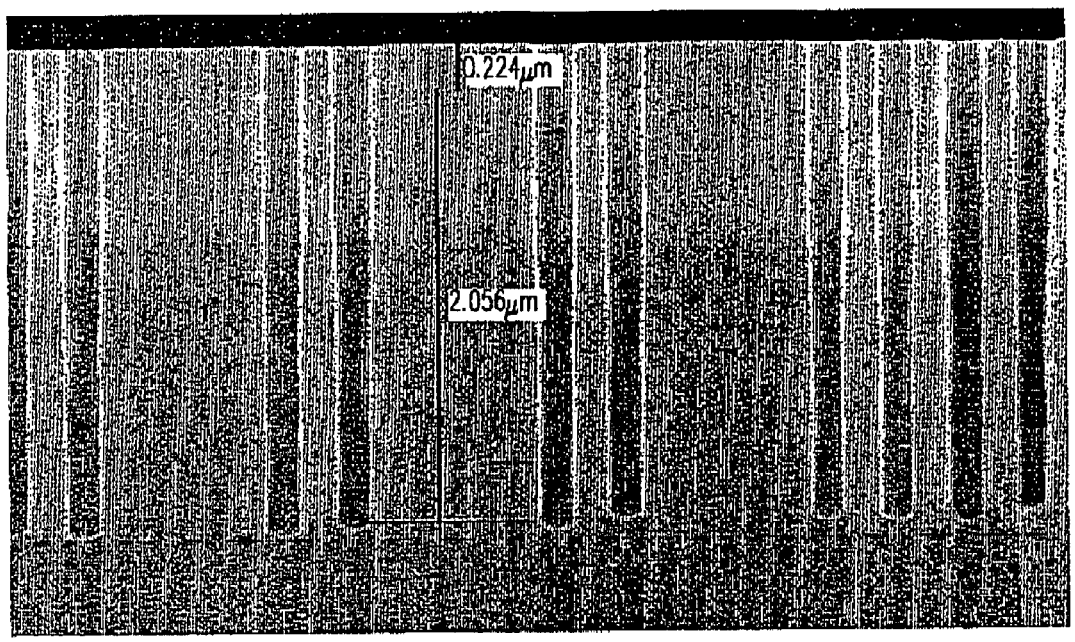

FIGS. 8A and 8B are pictures of scanning electron microscope, which respectively show a substrate with photoresist-filled deep trenches formed using a conventional method and using the method of the present invention. As shown in FIG. 8A, the conventional method of filling photoresist material into deep trenches leads to photoresist layers with non-uniform depth. On the other hand, the method according to the present invention produces photoresist layers with a uniform depth as shown in FIG. 8B.

Hence, utilizing the method of the present invention to fabricate deep trench capacitors or dual damascene structures not only prevents large variation in the properties of the capacitors or the dual damascene structures, but also eliminates or reduces the number of dummy trenches or vias to be used. In other words, available areas on the wafer are increased. In addition, the plasma etching process and the etching back process can be carried out in the same plasma-etching chamber. Thus, the fabrication process is simplified, the processing time is shortened and the production cost is reduced. Furthermore, the etching back process of the present invention can be triggered after the appearance of the second signal (point B in FIG. 3).

In the process of fabricating dual damascene structures, the via opening is usually formed before the trench. After forming the via openings, a photoresist layer is formed over the substrate to define the trench location. However, if the substrate has dense via regions and sparse via regions, problems such as inaccurate focusing and deviation in the critical dimension may occur. Yet, similar problems also occur even if the trenches are formed before the via openings.

Figure 9:
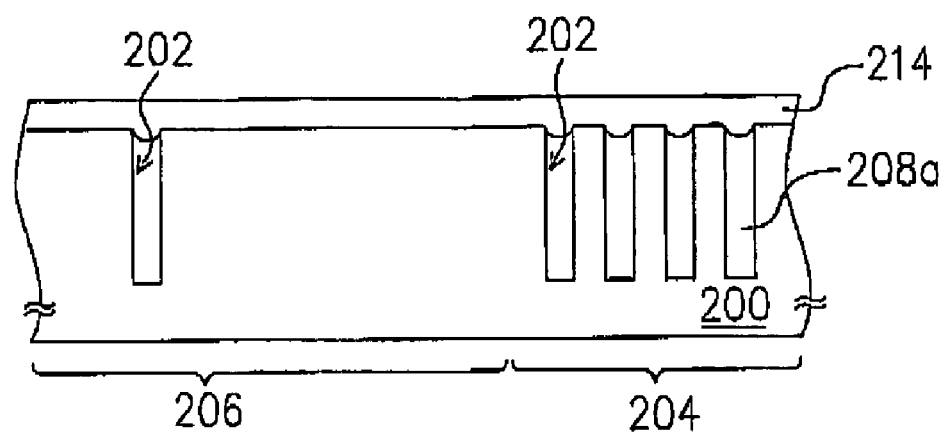
FIG. 9 is a cross-sectional view of a substrate with a dual damascene structure fabricated using the method according to the present invention.

FIG. 9 is a cross-sectional view of a substrate with a dual damascene structure fabricated using the method according to the present invention. FIG. 9 is a continuation of FIG. 2B where the openings 202 in FIG. 2B are via openings in the dielectric layer over the substrate 200. If the trench is formed first, the openings 202 are trenches in the dielectric layer over the substrate 200. As shown in FIG. 9, a photoresist layer 214 is formed over the substrate 200. Because the step height 210 (as shown in FIG. 2A) between the spin-on material layer 208 in the dense opening regions 204 and the sparse opening regions 206 has already been eliminated, the photoresist 214 has a uniform thickness. Hence, problems including the inaccurate focusing and the deviation of critical dimension in a subsequent photo-expose operation can be avoided. In addition, an anti-reflection coating may be deposited on the substrate 200 prior to forming the photoresist layer 214. On the other hand, if the openings 202 are via openings, an etching back process can be carrier out before forming the photoresist layer 214 so that the spin-on material layer 208a is etched to a level at a predetermined distance away from the top surface of the substrate 200.

In summary, the method of planarizing a spin-on material layer according to the present invention is capable of eliminating the steps height resulting from a difference in opening density across the substrate. Obviously, the planarization method can also be applied to coat a spin-on material layer over a substrate with a single opening or to coat a spin-on material layer over a substrate with a uniform opening density. Furthermore, the method of the present invention is able to remove the step heights on the spin-on material layer in a much simpler way than the conventional method so that the processing time is shortened and production cost is reduced. In addition, the method of the present invention also simplifies the processing steps needed to fabricate deep trench capacitor or dual damascene structures and increases the available area on a wafer. Ultimately, the production cost is lowered.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of planarizing a spin-on material layer, comprising the steps of:
   providing a substrate having at least an opening thereon;
   forming a spin-on material layer over the substrate, wherein the spin-on material layer completely fills the opening; and
   performing a plasma etching process to remove a portion of the spin-on material layer and expose the surface of the substrate, wherein the substrate is cooled throughout the plasma etching process so that an etching selectivity between the spin-on material layer on the substrate and the spin-on material layer within the opening is maintained to produce a planarized spin-on material layer.

2. The method of claim 1, wherein material constituting the spin-on material layer is selected from a group consisting of photoresist, bottom anti-reflection coating, spin-on glass and spin-on dielectric.

3. The method of claim 1, wherein the substrate is cooled down to a temperature below 50° C. during the plasma etching process.

4. The method of claim 1, wherein the step of controlling the temperature of the substrate during the plasma etching process comprises passing a fluid over the back of the substrate.

5. The method of claim 4, wherein the fluid passing over the back of the substrate is a gas or a liquid.

6. The method of claim 4, wherein the fluid passing over the back of the substrate is gaseous helium or chilled water.

7. The method of claim 1, wherein the opening is selected from a group consisting of a damascene opening for forming a dual damascene structure, a trench for forming a conductive line, a via opening, a contact opening and a deep trench for forming a deep trench capacitor.

8. The method of claim 1, wherein the substrate comprises a dense opening region and a sparse opening region and the spin-on material layer over the dense opening region has a thickness greater than the spin-on material layer over the sparse opening region.

9. The method of claim 8, wherein the plasma etching process further utilizes an etch ending signal derived from sensing the change in properties in spin-on material layer or the material on the substrate surface.

10. The method of claim 8, wherein the plasma etching process is controlled using an etch ending signal comprising a first signal and a second signal, where the first signal is produced when the spin-on material layer is removed to expose the substrate surface material in the dense opening region and the second signal is produced when the spin-on material layer is removed to expose the substrate surface material in the sparse opening region.

11. The method of claim 10, wherein the process of cooling the substrate is initiated as soon as the first signal is detected during the plasma etching process.

12. The method of claim 10, further comprising performing a etching back process to remove a portion of the spin-on material layer within the opening after detecting the second signal so that the top of the spin-on material layer is at a distance below the top of the substrate.

13. The method of claim 12, wherein the opening comprises a deep trench for forming a deep trench capacitor or a via opening for forming a dual damascene structure.

14. The method of claim 12, wherein the etching back process is carried out without cooling the substrate.

15. The method of claim 12, wherein the plasma etching process and the etching back process are performed inside the same plasma etching chamber.

16. The method of claim 10, wherein the plasma etching process further comprises: no arrangement for cooling the substrate before detecting the first signal;
   cooling the substrate after detecting the first signal but before detecting the second signal; and
   stopping cooling the substrate after detecting the second signal.

17. The method of claim 10, wherein the plasma etching process further comprises:
   cooling the substrate before detecting the second signal; and
   stopping cooling the substrate after detecting the second signal.

18. The method of claim 1, wherein the etching selectivity between the spin-on material layer over the substrate and the spin-on material layer inside the opening is greater than 3.

19. A method of fabricating a photoresist layer, comprising the steps of:
   providing a substrate having a dielectric layer thereon;
   forming a plurality of openings in the dielectric layer such that the substrate is divided into two regions, wherein each of the regions has a different density of openings;
   forming a spin-on material layer over the substrate, wherein the spin-on material layer completely fills the openings;
   performing a plasma etching process to remove a portion of the spin-on material layer and expose the surface of the substrate, wherein the substrate is cooled during the plasma etching process so that an etching selectivity between the spin-on material layer on the substrate and the spin-on material layer inside the openings is maintained to produce a planarized spin-on material layer; and
   forming a photoresist layer over the substrate.

20. The method of claim 19, wherein material constituting the spin-on material layer is selected from a group consisting of photoresist, bottom anti-reflection coating, spin-on glass and spin-on dielectric.

21. The method of claim 19, wherein the substrate is cooled down to a temperature below 50° C. during the plasma etching process.

22. The method of claim 19, wherein the step of controlling the temperature of the substrate during the plasma etching process comprises passing a fluid over the back of the substrate.

23. The method of claim 22, wherein the fluid passing over the back of the substrate is a gas or a liquid.

24. The method of claim 22, wherein the fluid passing over the back of the substrate is gaseous helium or chilled water.

25. The method of claim 19, wherein the openings comprise via openings for forming dual damascene structures.

26. The method of claim 19, wherein the openings comprise trenches for forming dual damascene structures.

27. The method of claim 19, further comprising forming an anti-reflection coating over the substrate before the step of forming the photoresist layer over the substrate.

28. The method of claim 19, further comprising performing an etching back process to remove a portion of the spin-on material layer before the step of forming the photoresist layer over the substrate so that the top of the spin-on material layer is at a predetermined distance below the top of the substrate.

29. The method of claim 19, wherein the etching selectivity between the spin-on material layer on the substrate and the spin-on material layer inside the openings is greater than 3.

* * * * *